(12) United States Patent
McHugh et al.

(10) Patent No.: US 6,676,429 B1
(45) Date of Patent: Jan. 13, 2004

(54) LAND GRID ARRAY CONNECTOR ASSEMBLY

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/316,477

(22) Filed: Dec. 10, 2002

(51) Int. Cl.[7] ............................................. H01R 13/62
(52) U.S. Cl. ......................................... 439/331; 439/73
(58) Field of Search ................................ 439/331, 330, 439/71–73, 526, 525

(56) References Cited

U.S. PATENT DOCUMENTS

| | | | | |
|---|---|---|---|---|
| 5,127,837 A | * | 7/1992 | Shah et al. ..................... | 439/71 |
| 5,387,120 A | * | 2/1995 | Marks et al. ................. | 439/331 |
| 5,647,756 A | * | 7/1997 | Twigg et al. ................ | 439/331 |
| 5,997,316 A | * | 12/1999 | Kunzel ......................... | 439/73 |
| 6,354,859 B1 | * | 3/2002 | Barabi et al. ................ | 439/331 |

* cited by examiner

Primary Examiner—Hien Vu
(74) Attorney, Agent, or Firm—Wei Te Chung

(57) ABSTRACT

An electrical connector assembly (1) for electrically connecting an electronic package with a circuit substrate. The connector assembly includes a socket and a fastening device surrounding the socket. The fastening device includes a frame (2), a cam actuator (4) pivotably mounted to a first side of the frame, and a metal clip (3) pivotably mounted to a second side of the frame. The clip includes a post (3211) at a free end (32) thereof. The cam actuator includes a cam (41) defining a spiral groove (413) receiving the post. When the cam is driven, it drives the post downwardly, and simultaneously the clip moves slightly toward an end of the first side of the frame. However, excessive such movement in this direction is blocked by a wall of the cam at the groove. The clip reaches a final pressing position, in which the clip firmly presses the electronic package.

13 Claims, 5 Drawing Sheets

LAND GRID ARRAY CONNECTOR ASSEMBLY

BACKGROUND OF THE INVENTION

1. Field of the Invention

The present invention relates to an electrical connector assembly for electrically connecting an electronic package such as a central processing unit (CPU) with a circuit substrate such as a printed circuit board (PCB), and particularly to a land grid array connector assembly having a fastening device for securing the CPU therein.

2. Description of Prior Art

FIG. 5 shows a conventional land grid array connector assembly 6 comprising a fastening device 60, and a socket 61 received in the fastening device 60. The fastening device 60 comprises a generally rectangular frame 63, and a lever 62 and a metal clip 64 respectively mounted to opposite sides of the frame 63. The frame 63 defines a pair of locating slots 66 at one side thereof, and a pair of guiding grooves 65 at an opposite side thereof. Each guiding groove 65 is bounded by a first wall 651 and an opposite second wall 652. The lever 62 has a pair of locating portions 623 pivotally received in the locating slots 66 of the frame 63, a driving portion 621 between the locating portions 623, and a handle portion 622 bent perpendicularly from one of the locating portions 623. The clip 64 has a pair of securing portions 641 movably received in the guiding grooves 65 of the frame 63, and a driving hook 644 formed at a free end thereof.

In use, the clip 64 is firstly oriented perpendicular to the frame 63, with the securing portions 641 disposed in the guiding grooves 65 close to the first walls 651. A central processing unit (CPU) 7 is attached on the socket 61, and a copper plate 8 which functions as a heat dissipation device is attached on the CPU 7. Then the clip 64 is rotated down to a horizontal position, with a pair of pressing arms and a pair of pressing pads of the clip 64 abutting the copper plate 8. The handle portion 622 of the lever 62 is rotated down, and the driving portion 621 of the lever 62 engages in the driving hook 644 of the clip 64. The driving portion 621 drives the driving hook 644 down until the clip 64 is in a final pressing position firmly pressing the copper plate 8 on the CPU 7. However, as can be seen from FIG. 6, during rotation of the clip 64, the securing portions 641 may simultaneously move along the guiding grooves 65 toward the second wall 652. When this happens, to the driving hook 644 moves beyond its correct position. As a result, when the handle portion 622 of the lever 62 is rotated, the driving portion 621 of the lever 62 cannot accurately engage in the driving hook 644 of the clip 64 to drive it. This leads to the clip 64 not reaching its correct final pressing position. Thus, the clip 64 fails to properly secure the copper plate 8 on the CPU 7.

In view of the above, a new land grid array connector assembly that overcomes the above-mentioned disadvantages is desired.

SUMMARY OF THE INVENTION

Accordingly, an object of the present invention is to provide an electrical connector assembly such as a land grid array (LGA) connector assembly for electrically connecting an electronic package such as a central processing unit (CPU) with a circuit substrate such as a printed circuit board (PCB), whereby the LGA connector assembly has a fastening device for securely and reliably locating the CPU in the LGA connector assembly.

Another object of the present invention is to provide a fastening device for an electrical connector such as a LGA socket to securely and reliably locate an electronic package such as a CPU in the LGA socket.

To achieve the above-mentioned object, a LGA connector assembly in accordance with a preferred embodiment of the present invention is for electrically connecting a CPU with a PCB. The LGA connector assembly comprises a socket and a fastening device surrounding the socket. The fastening device comprises an insulative frame having a first side and a second side opposite to the first side, a cam actuator pivotably mounted to the first side of the frame, and a metal clip pivotably mounted to the second side of the frame.

The clip comprises a plurality of pressing pads, and a post at a free end thereof. The cam actuator comprises a cam and a driver. The cam defines a spiral groove spanning between a circumferential surface of the cam and a center of the cam and facing the clip. The clip is rotated down from a vertical open position to a horizontal closed position, such that the post of the clip is received in the spiral groove of the cam. Movement of the post of the clip toward an end of the frame beyond the cam is limited by a wall of the cam at the spiral groove. Then, the driver is rotated to drive the cam to rotate about a central axis of the cam. The cam drives the post of the clip downwardly, and at the same time the clip moves slightly toward said end of the frame relative to the copper plate. However, excessive such movement in this direction is blocked by said wall of the cam. The handle portion of the driver continues to be rotated until it is locked in a final position. The clip is then at a final pressing position, in which the pressing pads of the clip firmly press down on the copper plate.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
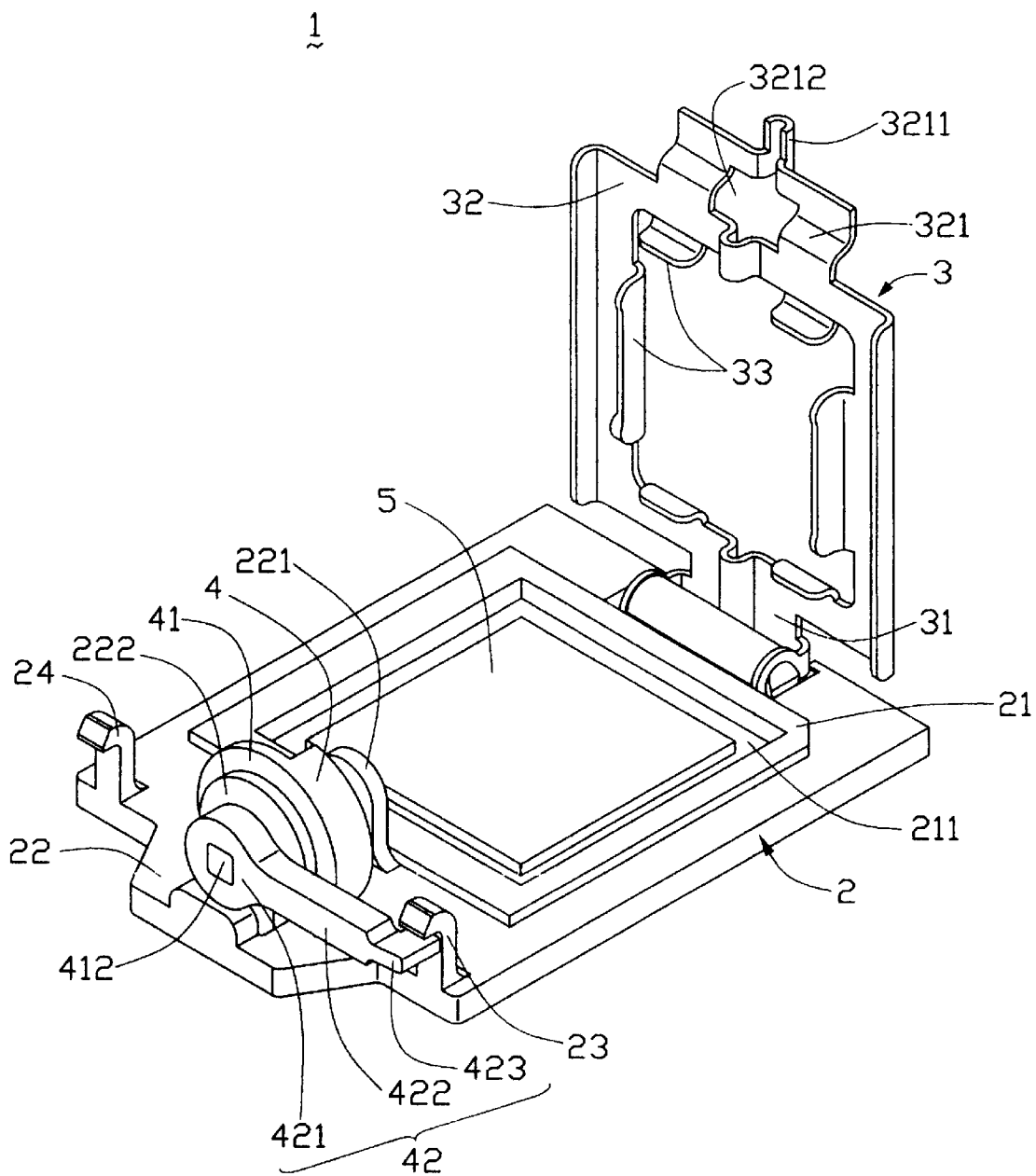
FIG. 1 is a perspective view of a land grid array connector assembly in accordance with a preferred embodiment of the present invention, showing a metal clip of the connector assembly at a vertical open position.
Figure 2:
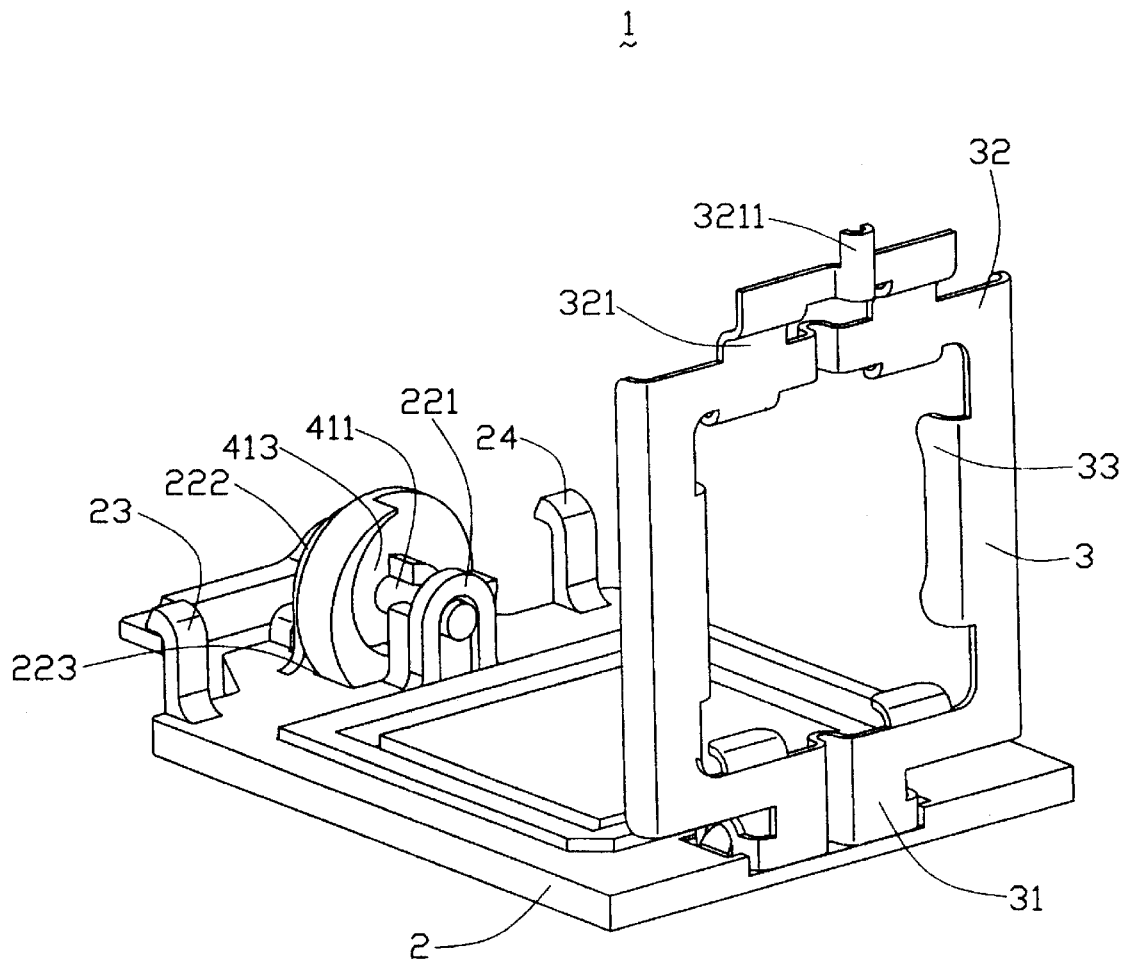
FIG. 2 is similar to FIG. 1, but viewed from another aspect.

Referring to FIGS. 1 and 2, a land grid array (LGA) connector assembly 1 in accordance with a preferred embodiment of the present invention is for electrically connecting a central processing unit (CPU) (not visible) with a printed circuit board (PCB) (not shown). The LGA connector assembly 1 comprises a socket (not visible) and a fastening device surrounding the socket. The socket has a plurality of LGA contacts provided therein. The fastening device comprises an insulative frame 2 having a first side and a second side opposite to the first side, a cam actuator 4 pivotably mounted to the first side of the frame 2, and a metal clip 3 pivotably mounted to the second side of the frame 2.

The frame 2 comprises a low-profile peripheral wall 21 on a top thereof. The peripheral wall 21 cooperates with a main body of the frame 2 to define a receiving recess 211 therebetween. The socket is arranged at a bottom of the receiving recess 211. The CPU is attached on the socket, and a copper plate 5 is attached on the CPU. Thus the CPU and the copper plate 5 are received in the receiving recess 211.

The first side of the frame 2 has an outer extending portion 22 adjacent a middle of a main portion thereof. A first hook-shaped lock 23 and a second hook-shaped lock 24 extend upwardly from respective opposite ends of the first side of the frame 2. A first supporting rack 221 is upwardly formed on the first side of the frame 2. A second supporting rack 222 is upwardly formed on the extending portion 22 of the frame 2, and is generally parallel to the first supporting rack 221. A receiving slot 223 is defined in the first side of the frame 2, between the first and second supporting racks 221, 222.

The clip 3 comprises a first end 31 pivotably mounted to the second side of the frame 2, an opposite second end 32 having an outer extending portion 321, and two spaced and parallel beams (not labeled) respectively interconnecting the first and second ends 31, 32. A plurality of symmetrically arranged pressing pads 33 extends perpendicularly from inner edges of the first and second ends 31, 32 and from the beams. A post 3211 is formed at a free end of the extending portion 321, and a gap 3212 is defined in the extending portion 321 between the post 3211 and the second end 32.

The cam actuator 4 comprises a cam 41 and a driver 42 for driving the cam 41. The cam 41 is partially received in the receiving slot 223 of the frame 2. A supporting pole sequentially passes through the first supporting rack 221, the cam 41 and the second supporting rack 222, thereby rotatably positioning the cam 41 on the frame 2. The supporting pole comprises a first supporting portion 411 at the first supporting rack 221, and a second supporting portion 412 respectively at the second supporting rack 222. The first supporting portion 411 is columnar, and the second supporting portion 412 has square cross-section. A spiral groove 413 is defined in the cam 41. The spiral groove 413 spans between a circumferential surface of the cam 41 and a center of the cam 41, and faces the clip 3. The driver 42 comprises a driving portion 421 fixed on the second supporting portion 412, a handle portion 423 for facilitating manual operation, and a connecting portion 422 interconnecting the driving portion 421 and the handle portion 423.

Figure 3:
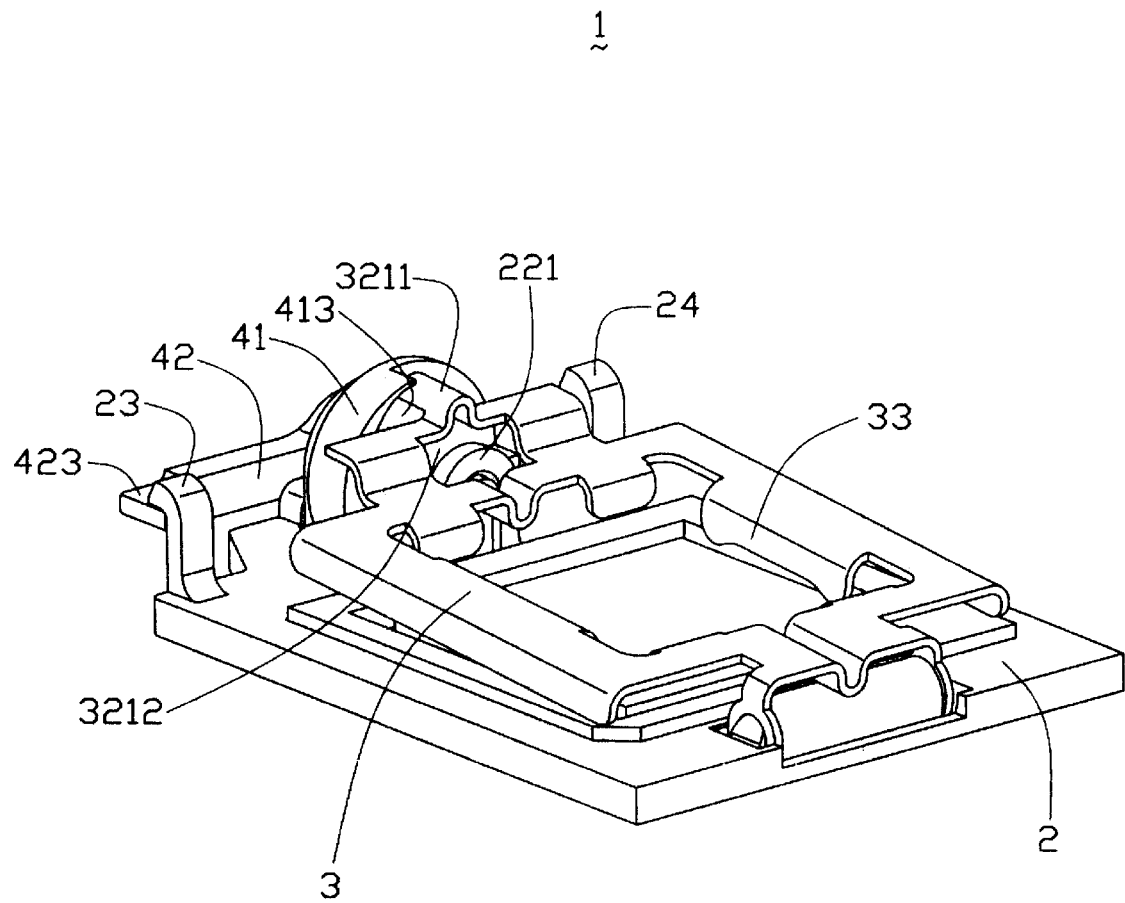
FIG. 3 is similar to FIG. 2, but showing the clip at a substantially horizontal closed position.
Figure 4:
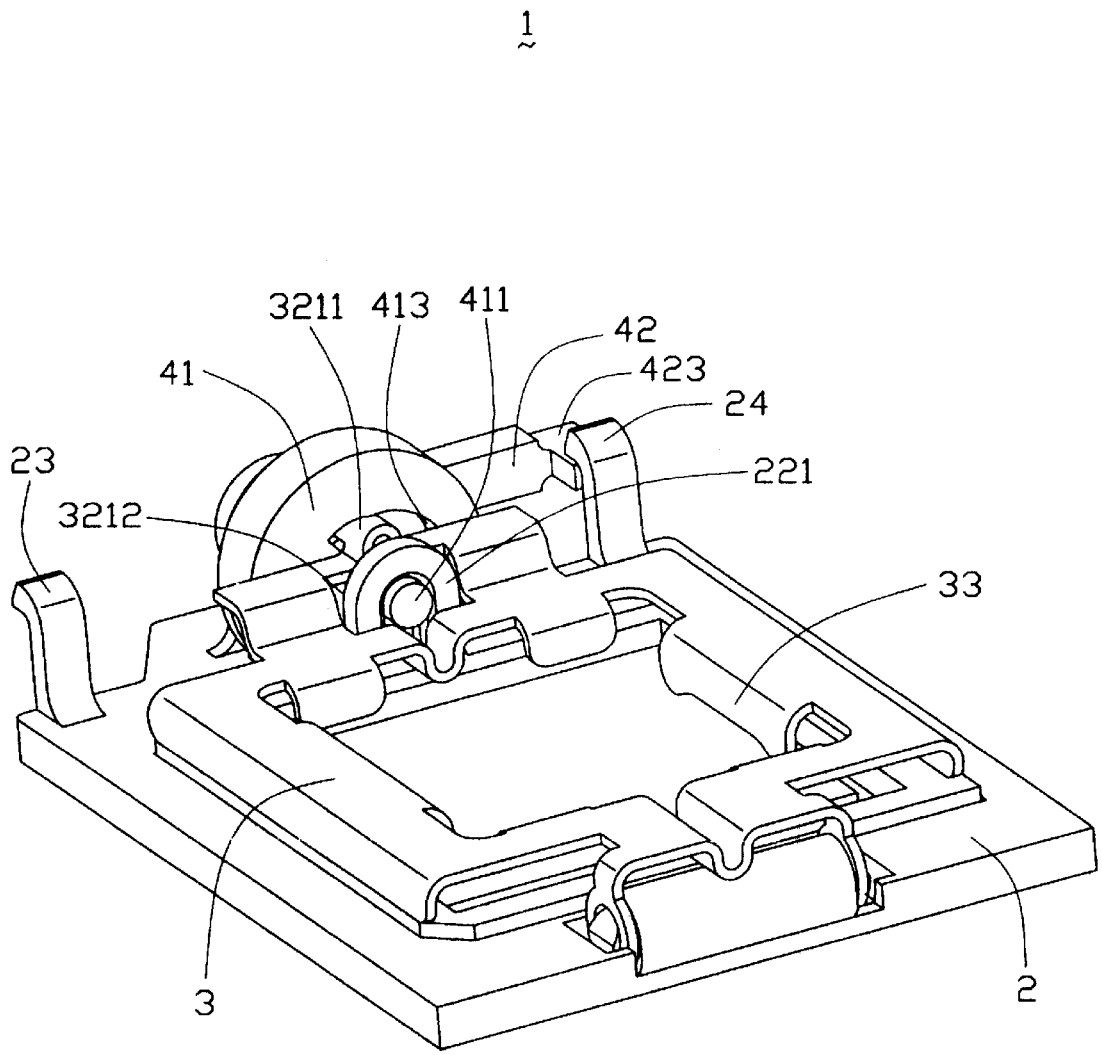
FIG. 4 is similar to FIG. 2, but showing the clip at the closed position.
Figure 5:
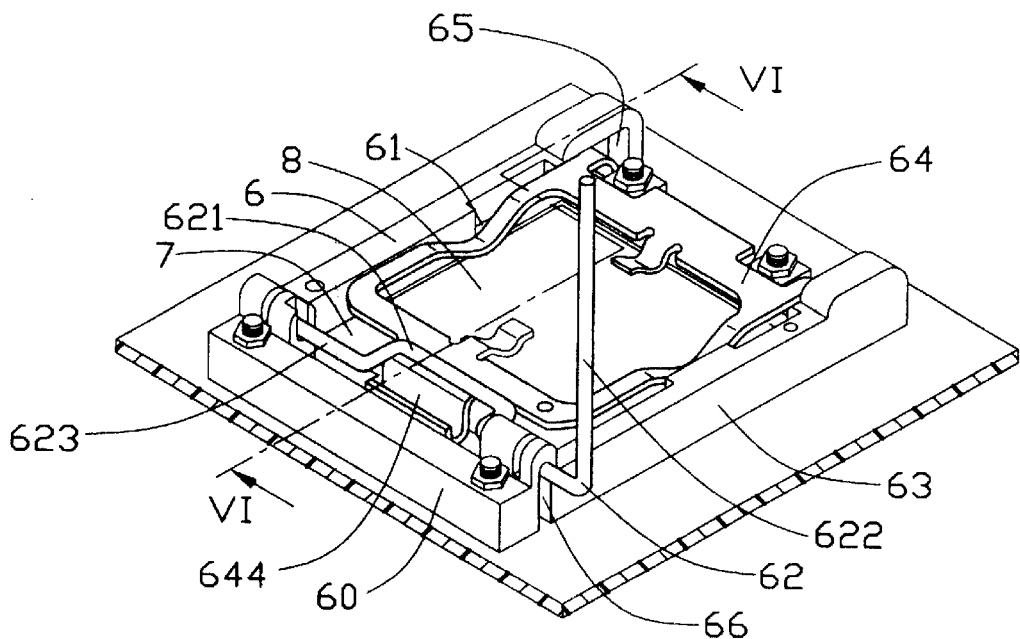
FIG. 5 is a perspective view of a conventional land grid array connector assembly.
Figure 6:
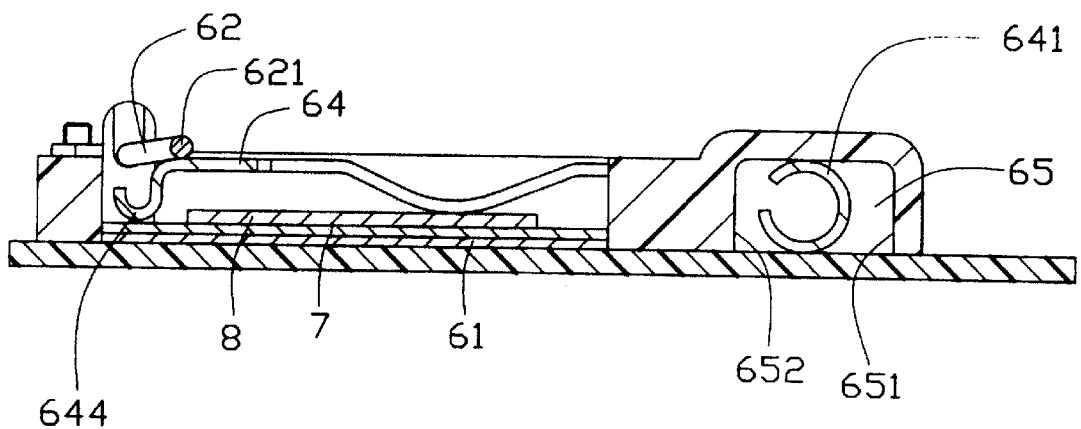
FIG. 6 is a cross-sectional view taken along line VI—VI of FIG. 5.

In use, the clip 3 is oriented perpendicular to the frame 2 in an open position. This enables the CPU and the copper plate 5 to be inserted into the receiving recess 211 of the frame 2 and then attached on the socket. The cam actuator 4 is oriented at an open position, in which the handle portion 423 of the driver 42 is locked by the first lock 23, and an outmost portion of the spiral groove 413 of the cam 41 is at a highest position (see FIGS. 1 and 2). Referring also to FIGS. 3 and 4, the clip 3 is rotated down to a substantially horizontal closed position until the pressing pads 33 abut the copper plate 5. At this position, the post 3211 of the clip 3 is received in the spiral groove 413 of the cam 41, and part of the first supporting rack 221 of the frame 2 is received through the gap 3212 of the clip 3. Thus the clip 3 is loosely engaged with the cam 41 of the cam actuator 4. Movement of the post 3211 of the clip 3 toward an end of the first side of the frame 2 is limited by a wall of the cam 41 at the spiral groove 413 (see FIG. 3). Then the driver 42 is rotated up and away from the first lock 23. The driver 42 drives the cam 41 to rotate about a central axis of the cam 41. The cam 41 drives the post 3211 of the clip 3 downwardly, and at the same time the clip 3 moves, slightly toward the end of the first side of the frame 2 relative to the copper plate 5. However, excessive such movement in this direction is blocked by the wall of the cam 41 at the spiral groove 413. The handle portion 423 of the driver 42 continues to be rotated until it is locked by the second lock 24. The clip 3 is then at a final pressing position, in which the pressing pads 33 of the clip 3 firmly press down on the copper plate 5.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly for electrically connecting an electronic package with a circuit substrate, the electrical connector assembly comprising:
   a socket; and
   a fastening device comprising an insulative frame, a cam actuator pivotably mounted to a first side of the frame, and a clip pivotably mounted to an opposite second side of the frame; wherein
      the cam actuator comprises a driver, and a cam having a groove defined therein, and the clip comprises a post received in the groove of the cam, and
      when the cam is driven by the driver, the cam drives the post of the clip toward the frame, and the clip can move slightly toward an end of the first side of the frame; wherein
         a first supporting rack and a second supporting rack are arranged on the first side of the frame, and a slot is defined in the first side of the frame between the first and the second supporting racks; wherein
            a first lock and a second lock are arranged at respective opposite ends of the first side of the frame, for respectively locking the driver of the cam actuator before and after pivoting of the driver.

2. The electrical connector assembly as claimed in claim 1, wherein a supporting pole sequentially passes through the first supporting rack, the cam and the second supporting rack, and the cam is partially received in the slot of the frame, thereby pivotably positioning the cam on the frame.

3. The electrical connector assembly as claimed in claim 2, wherein the supporting pole comprises a first supporting portion and a second supporting portion respectively at the first and the second supporting racks, and the driver is fixed on the second supporting portion.

4. The electrical connector assembly as claimed in claim 3, wherein the driver comprises a driving portion fixed on the second supporting portion of the supporting pole, a handle portion and a connecting portion interconnecting the driving portion and the handle portion.

5. The electrical connector assembly as claimed in claim 1, wherein the groove of the cam is spiral-shaped, spans between a circumferential surface of the cam and a center of the cam, and faces the clip.

6. The electrical connector assembly as claimed in claim 1, wherein the clip comprises a first end pivotably mounted to the second side of the frame, and a second end opposite said first end.

7. The electrical connector assembly as claimed in claim 6, wherein the post of the clip is provided at the second end thereof, and a plurality of pressing pads is symmetrically arranged at internal edges of the clip.

8. A fastening device for a socket, the fastening device comprising:

an insulative frame comprising a first side and a second side opposite to the first side;

a cam actuator pivotably mounted to the first side of the frame, the cam actuator comprising a cam and a driver, the cam having a groove defined therein; and a clip pivotably mounted to the second side of the frame, the clip having a post provided at a free end thereof, the post being received in the groove of the cam, wherein when the cam is driven by the driver, the cam drives the post of the clip toward the frame, and the clip can move slightly toward an end of the first side of the frame; wherein a first supporting rack and a second supporting rack are arranged on the first side of the frame, and a slot is defined in the first side of the frame between the first and the second supporting racks; wherein a supporting pole sequentially passes through the first supporting rack, the cam and the second supporting rack, and the cam is partially received in the slot of the frame thereby, pivotably positioning the cam on the frame; wherein a first lock and a second lock are arranged at respective opposite ends of the first side of the frame, for respectively locking the driver of the cam actuator before and after pivoting of the driver.

9. The fastening device as claimed in claim 8, wherein the supporting pole comprises a first supporting portion and a second supporting portion respectively at the first and the second supporting racks, and the driver is fixed on the second supporting portion.

10. The fastening device as claimed in claim 9, wherein the driver comprises a driving portion fixed on the second supporting portion of the supporting pole, a handle portion and a connecting portion interconnecting the driving portion and the handle portion.

11. The fastening device as claimed in claim 8, wherein the groove of the cam is spiral-shaped, spans between a circumferential surface of the cam and a center of the cam, and faces the clip.

12. The fastening device as claimed in claim 8, wherein the clip comprises a first end pivotably mounted to the second side of the frame, and the free end of the clip is opposite the first end thereof.

13. The fastening device as claimed in claim 12, wherein a plurality of pressing pads is symmetrically arranged at internal edges of the clip.

\* \* \* \* \*